United States Patent
Kawai et al.

(10) Patent No.: US 7,365,297 B2
(45) Date of Patent: Apr. 29, 2008

(54) OBJECT DETECTING APPARATUS HAVING A CURRENT ADJUSTER FOR CONTROLLING AMOUNT OF ELECTRIC CURRENT SUPPLIED TO A LASER DEVICE IN COMPENSATION FOR A DIVERSITY OF CURRENT-LUMINOSITY CHARACTERISTICS OF THE LASER DEVICE

(75) Inventors: Nobuharu Kawai, Okazaki (JP); Yoshiaki Hoashi, Kariya (JP)

(73) Assignee: DENSO Corporation, Kariya (JP)

( * ) Notice: Subject to any disclaimer, the term of this patent is extended or adjusted under 35 U.S.C. 154(b) by 489 days.

(21) Appl. No.: 11/076,304

(22) Filed: Mar. 9, 2005

(65) Prior Publication Data
US 2005/0201435 A1 Sep. 15, 2005

(30) Foreign Application Priority Data
Mar. 9, 2004 (JP) ............... 2004-065924

(51) Int. Cl.
*G01J 1/32* (2006.01)
(52) U.S. Cl. .................. 250/205; 250/214 R
(58) Field of Classification Search ........... 250/205, 250/214 R, 238, 214.1, 221; 372/29.01–29.02; 369/116; 359/229, 601, 603
See application file for complete search history.

(56) References Cited

U.S. PATENT DOCUMENTS 5,506,400 A * 4/1996 Honma et al. ............ 250/205

FOREIGN PATENT DOCUMENTS

| JP | 9-243729 | 9/1997 |
| JP | 10-239432 | 9/1998 |
| JP | 2002-031685 | 1/2002 |

OTHER PUBLICATIONS

Office Action dated Jun. 14, 2007 for corresponding Chinese Application No. 2005100541215 and English translation thereof.
Office Action for corresponding Chinese Application No. 2001100541215 dated Jul. 10, 2006 and English translation thereof.

* cited by examiner

*Primary Examiner*—Que T Le
(74) *Attorney, Agent, or Firm*—Harness, Dickey & Pierce, PLC

(57) ABSTRACT

An object detecting apparatus detects an object by using a laser beam emitted from a laser diode. The apparatus has a current adjuster. An amount of electric current supplied from the current adjuster to the laser diode is controlled to change an intensity of the laser beam, and is adjusted by a feedforward control based on a signal from a temperature sensor in the apparatus to compensate a drift of the laser diode characteristics.

6 Claims, 2 Drawing Sheets

OBJECT DETECTING APPARATUS HAVING A CURRENT ADJUSTER FOR CONTROLLING AMOUNT OF ELECTRIC CURRENT SUPPLIED TO A LASER DEVICE IN COMPENSATION FOR A DIVERSITY OF CURRENT-LUMINOSITY CHARACTERISTICS OF THE LASER DEVICE

CROSS REFERENCE TO RELATED APPLICATION

This application is based on Japanese Patent Application No. 2004-65924 filed on Mar. 9, 2004, the disclosure of which is incorporated herein by reference.

FIELD OF THE INVENTION

The present invention relates to an object detecting apparatus disposed on a vehicle, more specifically to an object detecting apparatus having a laser device.

BACKGROUND OF THE INVENTION

A conventional object detecting apparatus is disclosed in a Japanese Patent Document JP-A-2002-031685. The apparatus comprises a light emitting device that emits a laser beam, a polygonal mirror in a shape of a six-sided horizontally-sliced pyramid that rotates to reflect the laser beam, and a light receiving device that picks up reflection of the laser beam by an object. The apparatus projects the laser beam reflected by the polygonal mirror toward the front of the vehicle. The laser beam reflected by the polygonal mirror is so controlled that it scans a predetermined area of space in front of the subject vehicle. Reflection of the laser beam from, for example, a preceding vehicle is then picked up by the light receiving device and gives a measurement of distance to the preceding vehicle.

The intensity of the laser beam used in this type of object detecting apparatus has to be a certain level or higher in order to measure a long range of distance. On the other hand, a person's eyes may be hypersensitive upon direct exposure to this intensity of laser beam at a very short distance.

Therefore, the object detecting apparatus changes the intensity of the laser beam according to the conditions of the subject vehicle. For example, an object detecting apparatus used in a preceding vehicle tracking system that controls the subject vehicle to follow a preceding vehicle at a predetermined distance changes the intensity of the laser beam on condition that the subject vehicle, and the preceding vehicle, is either running or stopping. That is, the intensity of the laser beam is lessened below a certain level in order to maintain a certain range of measurement with an assured safety to the eyes when the subject vehicle is stopping, compared to the intensity being used by the subject vehicle when it is running. This is because the laser beam of the apparatus will not be directed to the eyes when the subject vehicle is running, while it may be directed to the eyes when the subject vehicle is stopping.

The above-described situation explains the necessity of intensity control of the laser beam used in the object detecting apparatus. This situation necessitates a precise control of the intensity of the laser beam.

Typical characteristics of laser diodes, as shown in a diagram in FIG. 4, also support the necessity of the intensity control. Laser diodes used to generate the laser beam are low in fidelity in terms of Current (represented by "I" in the diagram)—Luminosity characteristics (I-L characteristics hereinafter) when luminosity (luminous intensity) of the laser beam is low. The difference of laser beam intensity against a certain electric current can be seen, for example, as a difference between the diversified characteristics curves of MAX, TYP, and MIN in FIG. 4. The I-L characteristics in this diagram differ in a wide range (vertically spread) when an input current is specified, or a certain target luminous intensity falls on a wide range (horizontally spread) of input current value depending on the I-L characteristics of each laser diode.

This leads to a problem that the intensity of the laser beam does not fit in a predetermined range even when an input current is determined based on the I-L characteristics curve because of the diversified I-L characteristics of each laser diode.

The I-L characteristics of the laser diode are also influenced by the temperature of the diode. That is, a certain value of electric current input applied to a laser diode does not always generate the same laser beam intensity. This is another cause of the same problem that the intensity of the laser beam does not fit in a predetermined range.

SUMMARY OF THE INVENTION

In view of the above-described problems, it is an object of the present invention to provide an object detecting apparatus having an adjusting function to compensate a diversified I-L characteristics of each laser diode, when the intensity of the laser beam is decreased to a predetermined level for the safety of human eye. It is another object of the present invention to provide an object detecting apparatus having a control function to compensate a change of I-L characteristics of the laser diode caused by a temperature change.

According to the present invention, a light emitting device receives an electric current being adjusted by a current adjuster to compensate the individually different I-L characteristics of a laser diode when the intensity of the laser beam is controlled to be less than a predetermined level. As a result, the intensity of the laser beam emitted from the light emitting device fits in a target range regardless of the individually different I-L characteristics of the laser diode.

The intensity of the laser beam is adjusted in a manufacturing process of the object detecting apparatus by changing the electric current value supplied from the current adjuster for an adjustment of the diversified I-L characteristics. Therefore, the output current value from the current adjuster can compensate the individually different I-L characteristics of the laser diode, and the intensity of the laser beam fits in a predetermined range.

Thus, the intensity of the laser beam can be precisely controlled in a predetermined range to have a measurement functionality of a certain distance regardless of the diversified I-L characteristics of each laser diode.

According to the present invention, a temperature sensor in the apparatus picks up a temperature of the laser diode, and the intensity of the laser beam is compensated based on the I-L characteristics of the laser diode. This compensation is an adjustment for the I-L characteristics change caused by a temperature change. The current adjuster compensates the changed I-L characteristics by controlling the output current value therefrom based on a signal from the temperature sensor.

The current adjuster uses a signal from the temperature sensor to control the output current value in compensation of a temperature change. Therefore, the output current value from the current adjuster takes the I-L characteristics change caused by the temperature into account, and thus a precise control of the intensity of the laser beam is achieved regardless of the temperature of the light emitting device.

As a result, the intensity of the laser beam can be precisely controlled to a predetermined level to have a measurement functionality of a predetermined range of distance.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Figure 1:
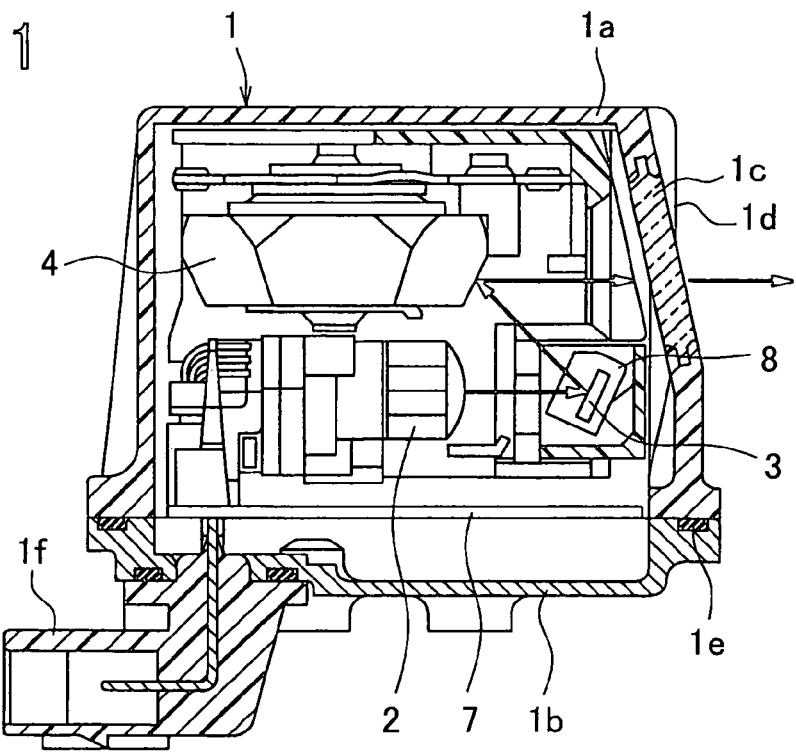
FIG. 1 is a vertical cross-sectional view of an object detecting apparatus according to an embodiment of the present invention.
Figure 2:
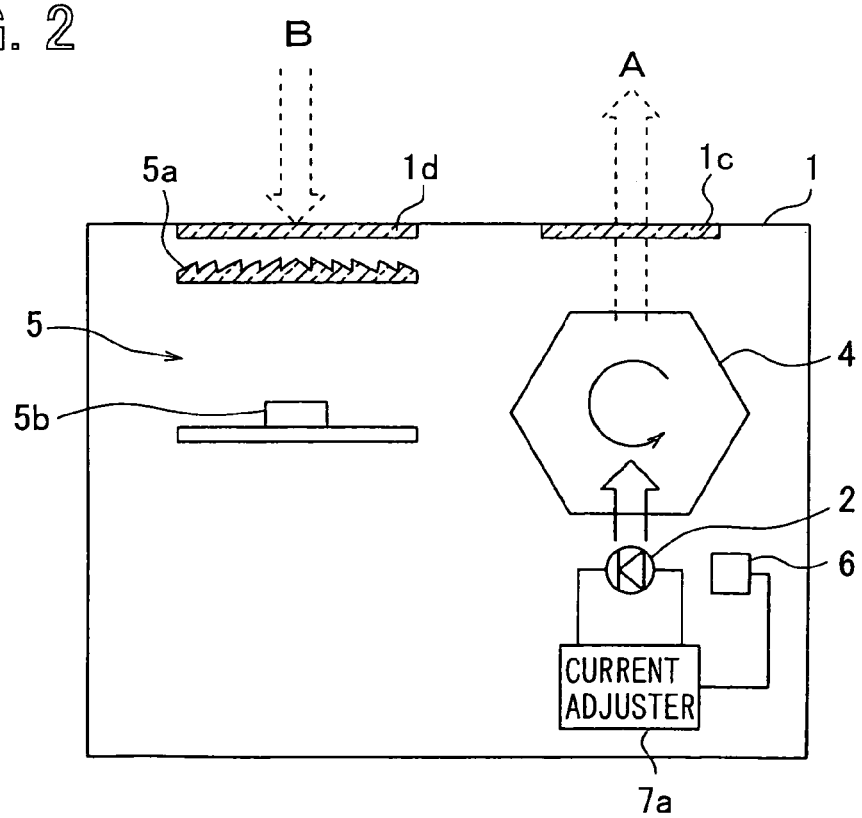
FIG. 2 is a schematic structure of the object detecting apparatus shown in FIG. 1.

An object detecting apparatus is shown in FIGS. 1 and 2. This apparatus is mounted on an automotive vehicle. The right side of the apparatus in FIG. 1 is, for example, directed to a front side of the vehicle, and the apparatus typically works as a laser radar to detect a distance between an object such as a preceding vehicle in a cruise control system.

The object detecting apparatus is enclosed in a substantially cubic resin case 1 with various parts contained therein, as shown in FIG. 1. The case 1 includes a first case part 1a, and a second case part 1b. The first case 1a is in a box shape having an opening on one side. A space in the first case 1a encloses various parts. The first case part 1a is made of resin except for a face on the front side of the vehicle which has a light emitting window 1c and a light receiving window 1d both made of a transparent material such as glass, acrylic resin or the like. The second case part 1b is, for example, made of metal. The opening of the first case part 1a is covered by the second case part 1b with a seal 1e interposed therebetween.

A connector 1f partially protruding from the case 1 is disposed on the second case part 1b. The connector 1f is used for an electrical connection between circuits in the case 1 and outside circuits.

The case 1 includes, more specifically in this case, a light emitting device 2, a reflection mirror 3, a polygon mirror 4, a light receiving device 5, and a temperature sensor 6, as well as various kinds of control circuits and a circuit board 7 having a current adjuster 7a.

The light emitting device 2 is driven by a current output from the current adjuster 7a on the circuit board 7. The light emitting device 2 projects a laser beam toward the mirror 3. The light emitting device 2 has, for example, a laser diode to generate a pulsing laser beam (scanning light).

The mirror 3 reflects the laser beam generated by the light emitting device 2 in a direction of polygon mirror 4. The mirror 3 is tiltably supported by a supporting member 8 which is fixed on the case 1. The mirror 3 is tilted by a motor driven by a circuit on the circuit board 7 (not shown in FIGS.) to precisely adjust a reflection angle (e.g. approximately at every 1 degree).

The polygon mirror 4 is in a shape of six-sided pyramid with its pointed end being cut off by a plane parallel to the bottom of the pyramid. The polygon mirror 4 is rotatably supported by a vertical axis fixed on the circuit board 7. The polygon mirror 4 is rotated by a motor (not shown in the drawing) controlled by a circuit on the circuit board 7. The circuit board 7 and the polygon mirror 4 are fixed downward on the inside of the upper face of the case 1. The polygon mirror 4 rotates to serve as a scanning mirror with all of the six-sided faces being used as a mirror.

The polygon mirror 4 reflectably directs a laser beam reflected by the mirror 3 toward a front direction of the subject vehicle. The rotation of the motor-driven polygon mirror 4 creates a scanning movement of the laser beam when all of those faces of the polygon mirror 4 reflect the pulsing laser beam over a period of time in synchronization with the rotation. A space in front of the subject vehicle is scanned in this manner.

The light receiving device 5 includes, as shown in FIG. 2, a Fresnel lens 5a and a light sensitive element 5b such as a photo diode. The Fresnel lens 5a collects the laser beam reflected by the object to be focused on the light sensitive element 5b. The light sensitive element 5b outputs an electric current or a voltage that is proportional to the intensity of the collected laser beam. The light receiving device 5 picks up the reflected laser beam projected toward the upper direction in FIG. 2.

The light receiving device 5 is arranged laterally with the polygon mirror 4. That is, the light receiving device 5 is located laterally in a direction perpendicular to the axis of the polygon mirror 4.

The temperature sensor 6 is disposed in a proximity of the laser diode in the light emitting device 2. The sensor 6 is typically disposed on the circuit board 7. The sensor 6 outputs a signal proportional to the temperature of the light emitting device 2.

The circuit board 7 has the current adjuster 7a among other circuits, as described before. The current adjuster 7a outputs a pulsing current to the light emitting device 2 to generate a laser beam, beside adjusting the current value to control the intensity of the laser beam based on the signal from the temperature sensor 6.

The current adjuster 7a has an adjusting capability of its own output, and the output of the current adjuster 7a is fine-tuned in a detection process of the object detecting apparatus. That is, the individually different I-L characteristics of each laser diode is compensated, and the intensity of the laser beam is standardized by, for example, adjusting determining factors of the output current value in a control circuit.

In this manner, the output current value of the current adjuster 7a is determined to absorb the individually different I-L characteristics of each laser diode, and the intensity of the laser beam is controlled to a predetermined value according to the vehicle's running condition. That is, the intensity of the laser beam is decreased to a predetermined level for the safety of human eye, with a maintained measurement functionality of a predetermined distance. Therefore, the output current value of the current adjuster 7a reflects the difference of the I-L characteristics of each laser diode to generate a predetermined level of the laser beam intensity regardless of the diversified I-L characteristics of each laser diode.

Figure 3:
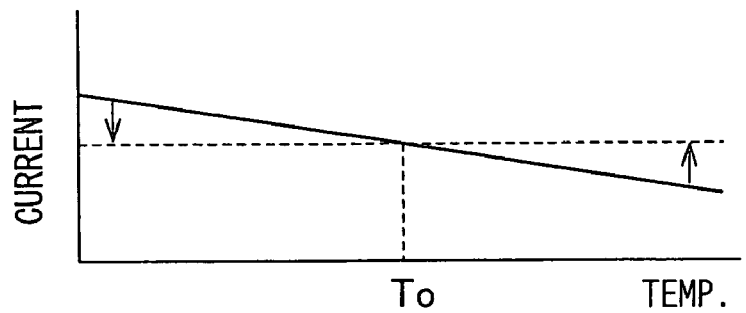
FIG. 3 is a diagram of a temperature-current compensation characteristics.

Further, the current adjuster 7a uses the signal from the temperature sensor 6 for a temperature correction (adjustment) of its output current value in a feedforward control. Specifically, as shown in FIG. 3, the output current value is decreased and increased as the detected temperature decreases and increases from a room temperature To respectively, because the current in the laser diode and hence the laser diode output light intensity increases and decreases as the detected temperature decreases and increases respectively. A standard output current value of the current adjuster 7a, being determined based on a certain temperature (e.g. room temperature To), causes a diversified intensity of the laser beam when the I-L characteristics of the laser diode in the light emitting device 2 is under the influence of a temperature change. Therefore, for a compensation of temperature change, the output current value of the current adjuster 7a is decreased from the standard output current value when the intensity of the laser beam is increasing, and the output current value of the current adjuster 7a is increased from the standard output current value when the intensity of the laser beam is decreasing.

For example, a memory in the current adjuster 7a may store a temperature correction map that represents variations of the I-L characteristics of the laser diode caused by the temperature, and the intensity of the laser beam can be controlled within a predetermined range by reflecting the variation of the I-L characteristics of the laser diode in an adjustment of the output current value of the current adjuster 7a.

The object detecting apparatus undergoes an adjustment process of the output current value of the current adjuster 7a prior to the shipment as a product.

Figure 4:
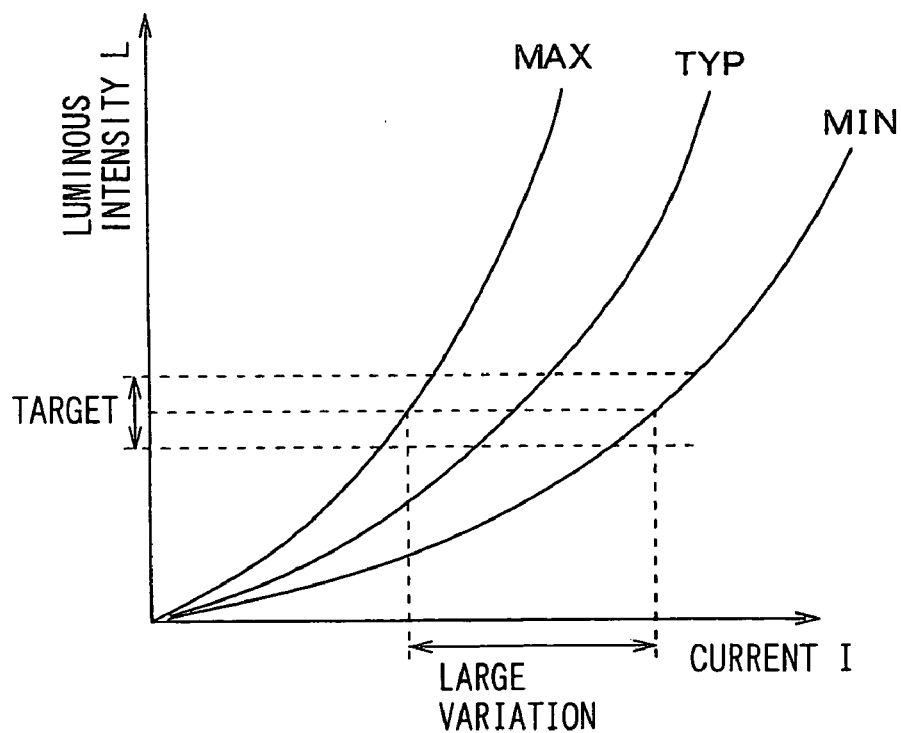
FIG. 4 is a diagram of an individually different I-L characteristics of a laser diode.

For example, the intensity of the laser beam from the light emitting device 2 is inspected for a fidelity against a standard output curve of the laser diode on a display of a testing device such as an oscilloscope (not shown in FIGS.). The output current value of the current adjuster 7a is then adjusted so that the output curve of each laser diode under inspection traces the standard output curve. That is, the determining factors of the output current value in the control circuit are adjusted. For example, the intensity of the laser beam is adjusted within a target range by driving a laser diode having the MAX characteristic curve in FIG. 4 with a lower current compared to a laser diode having the TYP characteristic curve, and by driving a laser diode having the MIN characteristic curve with a higher current compared to the TYP type. In this manner, the output current value of the current adjuster 7a in each product reflects a compensation for each laser diode I-L characteristics used therein, and thus the intensity of the laser beam is controlled to have the intensity according to the vehicle's running condition.

In operation, the object detecting apparatus operates in two modes, that is, a normal output mode and a decreased output mode. The apparatus operates in the normal output mode when the subject vehicle condition is in running or the like, and in the decreased output mode when the subject vehicle condition is in stopping or the like.

The object detecting apparatus used in a cruise control system is taken as an example in the explanation. In this case, the apparatus measures a distance between the subject vehicle and the preceding vehicle when the cruise control system is turned on.

The apparatus operation in the normal output mode is performed in the following manner. The mirror 3 is tilted to be in the predetermined position using the motor controlled by a signal from the control circuit. Then, the laser beam generated by the light emitting device 2 is projected into a space in front of the subject vehicle after being reflected by the mirror 3 and the polygon mirror 4 through the light emitting window 1c in the direction of dotted arrow A in FIG. 2. The laser beam, being reflected on the preceding vehicle or the like, comes back into the apparatus through the light receiving window 1d and the Fresnel lens 5a to be focused on the light sensitive element 5b in the direction of dotted arrow B in FIG. 2.

The light sensitive element 5b, then, outputs a current or voltage proportional to the reflected laser beam. The output from the light sensitive element 5b is amplified by an amplifier circuit 6b to be supplied to a calculation circuit on the circuit board 7 (not shown in FIGS.). The calculation circuit calculates a distance to the preceding vehicle using the following formula based on the speed of the laser beam and an elapsed time between projection and reception of the laser beam.

Distance to a preceding vehicle=speed of the laser beam×elapsed time/2  [Formula]

The calculated distance between the preceding vehicle and the subject vehicle is, then, output to an external circuit such as an engine ECU, a brake ECU, or the like through the connector 1f on the case 1. Based on this output, an engine output or a braking force is controlled to maintain a predetermined distance to the preceding vehicle.

In the decreased output mode, the output current value of the current adjuster 7a is determined based on an individually different I-L characteristics of the laser diode in each product and a feedforward temperature correction by the signal from the temperature sensor 6.

The output current value from the current adjuster 7a determined in the above-described manner is then supplied to the light emitting device 2 to generate the laser beam. The intensity of the laser beam is thus controlled in a range that is safe for the eyes and is strong enough to measure a predetermined distance.

As described above, the object detecting apparatus has an adaptability of its laser beam output. The output of the laser beam is adjusted by controlling the output current value of the current adjuster 7a in a manufacturing process of the apparatus. In this process, the individually different I-L characteristics of the laser diode is taken into account to control the intensity of the laser beam within a predetermined range. As a result, the intensity of the laser beam of each product (the object detecting apparatus) can be controlled to be an expected level with a predetermined accuracy, because the adjusted output current value of the current adjuster 7a absorbs the difference of the I-L characteristics of each laser diode.

Further, the current adjuster 7a controls its output current value by a feedforward control based on the output signal from the temperature sensor 6 in order to perform temperature correction. As a result, the intensity of the laser beam can be controlled to be an expected level with a predetermined accuracy even when the I-L characteristics are changed by changing temperature of the light emitting device 2, because the feedforward control of the output current value of the current adjuster 7a absorbs the change of the I-L characteristics by the temperature.

The intensity of the laser beam emitted from the light emitting device 2 used in the apparatus can be controlled accurately in the above-described manner. Therefore, the intensity of the laser beam falls in a range that is safe for the human eye and yet strong enough to measure a predetermined distance.

Although the present invention has been fully described in connection with the preferred embodiments thereof with reference to the accompanying drawings, it is to be noted that various changes and modifications will become apparent to those skilled in the art.

For example, the polygon mirror 4 and the light receiving device 5 in the object detecting apparatus are arranged side by side (horizontally) in the above embodiment. However, a different arrangement of those parts may also be allowed.

Such changes and modifications are to be understood as being within the scope of the present invention as defined by the appended claims.

What is claimed is:

1. An object detecting apparatus for detecting an object in a front area comprising:
    a light emitting device having a laser diode to project a laser beam;
    a light receiving device receiving a reflection of the laser beam; and
    a current adjuster controlling an amount of an electric current supplied to the light emitting device,
    wherein the laser beam is projected to detect an object based on the reflection of the laser beam received by the light receiving device,
    wherein the amount of the electric current supplied from the current adjuster controls a luminous intensity of the laser beam, and
    wherein the luminous intensity of the laser beam is adjusted to be within a predetermined range by a control of the amount of the electric current supplied from the current adjuster in compensation for a diversity of current—luminosity characteristics of an individual laser diode used in the light emitting device.

2. The object detecting apparatus of claim 1 further comprising:
    a case mounted on a vehicle;
    a light emitting window being disposed on the case for the laser beam passing outward therethrough from the case; and
    a light receiving window being disposed on the case for the reflection of the laser beam passing inward therethrough into the case,
    wherein the laser beam is projected through the light emitting window to detect an object based on the reflection of the laser beam received by the light receiving device.

3. The object detecting apparatus of claim 1 further comprising:
    a temperature sensing device outputting a signal that reflects a temperature of the laser diode, wherein
    the luminous intensity of the laser beam is adjusted based on the signal from the temperature sensing device through a control of the amount of the electric current supplied from the current adjuster in compensation for a drift of current luminosity characteristics of the laser diode caused by a variation of temperature.

4. An object detecting apparatus for detecting an object in a front area comprising:
    a light emitting device having a laser diode to project a laser beam;
    a light receiving device receiving a reflection of the laser beam;
    a current adjuster controlling an amount of an electric current supplied to the light emitting device; and
    a temperature sensing device outputting a signal that reflects a temperature of the laser diode,
    wherein the laser beam is projected to detect an object based on the reflection of the laser beam received by the light receiving device, and
    wherein a luminous intensity of the laser beam is adjusted based on the signal from the temperature sensing device through a control of an amount of the electric current supplied from the current adjuster in compensation for a drift of current luminosity characteristics of the laser diode caused by a variation of temperature.

5. The object detecting apparatus of claim 3, wherein the signal from the temperature sensing device is represented either by a change of an output electric current therefrom or a change of an output voltage therefrom.

6. The object detecting apparatus of claim 1, wherein the light emitting device and the light receiving device are disposed in a close proximity to each other in the apparatus.

* * * * *